United States Patent [19]

Johannes et al.

[11] Patent Number: 4,779,128
[45] Date of Patent: Oct. 18, 1988

[54] DIGITAL LOW-PASS FILTER WITH IMPROVED FREQUENCY REDUCTION CHARACTERISTICS

[75] Inventors: Kurt-Joachim Johannes; Rolf-Dieter Gutsmann; Detlef Deutschmann; Otto Warmuth; Walter H. Demmer, all of Hamburg, Fed. Rep. of Germany

[73] Assignee: U.S. Philips Corp., New York, N.Y.

[21] Appl. No.: 927,782

[22] Filed: Nov. 5, 1986

[30] Foreign Application Priority Data

Nov. 5, 1985 [DE] Fed. Rep. of Germany ....... 3539172

[51] Int. Cl.$^4$ .......................... H04N 5/14; H04N 9/64
[52] U.S. Cl. .................................. 358/21 R; 358/37; 358/166
[58] Field of Search .................. 358/21 R, 35, 36, 37, 358/40, 166, 160

[56] References Cited

U.S. PATENT DOCUMENTS

| 4,355,326 | 10/1982 | Lee | 358/36 |
|---|---|---|---|
| 4,422,094 | 12/1983 | Lewis | 358/37 |
| 4,597,011 | 6/1986 | Baker | 358/37 |

OTHER PUBLICATIONS

14 Statt 16 Bit D/A-Umsetzer fur den Audiobereich, by Dick Goedhart, et al., Analogtechnik-Elektronik 14/15.7, 1983, pp. 62-64.

*Primary Examiner*—Tommy P. Chin
*Attorney, Agent, or Firm*—Gregory P. Gadson

[57] ABSTRACT

The invention relates to a digital low-pass filter which effects a frequency reduction by a factor which is equal to the ratio w/2 between the frequency of the input signal and the frequency of the output signal, wherein w is an odd integer. The input signal is applied to m series-arranged registers. The input signal of the first and the output signals of all the registers are multiplied by coefficients. A change-over switch precedes an input of each multiplier, the change-over switch switching the coefficients symmetrically. The switching instants are always symmetrical relative to a reference sampling instant. The filter is particularly suitable for use in video signal processing, to reduce negative influences of an analog-to-digital converter.

10 Claims, 3 Drawing Sheets

DIGITAL LOW-PASS FILTER WITH IMPROVED FREQUENCY REDUCTION CHARACTERISTICS

BACKGROUND OF THE INVENTION

The invention relates to a digital low-pass filter comprising m series-arranged registers, a digital input signal, which is present as a sequence of amplitude-discrete sampling values having a sampling frequency determined by a clock signal, being applied to the first of these registers, multipliers multiplying by switchable coefficients subsequences of (m+1) sampling values at the input of the first register, and the outputs of the registers and a first adder to which the output signals of the multipliers are applied.

Such a low-pass filter is disclosed in the periodical "Elektronik", 14./15.07.1983, pages 61 to 64 and is used in the digital-to-analog conversion of audio signals. The signals are entered into the low-pass filter at a frequency of 44.1 kHz and read at a frequency of 176.4 kHz. The word-length of the 16-bit input signal is increased to 28 bits using multiplication by 12-bit coefficients in the low-pass filter. In a subsequent noise shaper the signal is rounded to 14 bits, the round-off error is added to the input signal of the noise shaper via a register and the rounded-off output signal is applied to a digital-to-analog converter. The output signal of the circuit arrangement has a greater signal-to-noise ratio than an output signal from a 14-bit digital-to-analog converter without low-pass filter and without noise shaper.

Digital video signal processing requires a sampling frequency which does just satisfy the sampling theorem, in order not to increase, for example, the cost of delay elements unnecessarily. The current analog-to-digital converters appropriate to this object which operates at, for example, a chrominance carrier frequency of 4.43 MHz with a sampling frequency of 13.5 MHz produce odd harmonics of the chrominance sub-carrier which negatively influence the luminance signal. More specifically the third harmonic of the chrominance sub-carrier, located at 30.3 MHz, is annoying, as it causes interference in the luminance signal also at 0.2 MHz because of the periodicity of the spectrum. The interference in the third harmonic of the chrominance sub-carrier can be avoided by increasing the sampling frequency of the analog-to-digital converter. So as not to increase the cost and design effort of the subsequent digital circuits, the prior art digital low-pass filter can be added with the object of reducing the sampling frequency. An advantageous sampling frequency for the analog-to-digital converter is obtained at a frequency of 20.25 MHz. In a further signal processing operation using the 13.5 MHz sampling frequency the digital low-pass filter must provide a reduction by a factor of 1.5.

SUMMARY OF THE INVENTION

The invention has for its object to provide a digital low-pass filter of the type defined in the opening paragraph such that when the ratio between the frequency of the input signal and the frequency of the output signal exceeds unity, and twice its value is an odd number, the digital low-pass filter can be realized at little cost.

According to the invention, this object is accomplished in that a change-over switch is arranged at one of the two inputs of each multiplier such that in one position of the change-over switch the $j^{th}$ sampling value of the sub-sequences and in the other position the $k^{th}$ sampling value of the sub-sequences are always multiplied by the same coefficients, wherein $j+k=m+2$, that the ratio n of the sampling frequency to the switching frequency of the change-over switch exceeds two and is a whole number, and that the two switching instants of the change-over switches are symmetrical with respect to each $n^{th}$ sampling instant of the sequence.

In the low-passfilter according to the invention the switching instants are provided symmetrically relative to each $n^{th}$ sampling value to ensure that the number of coefficients does not exceed the number of multipliers. The change-over switches are so incorporated in the circuit that, for example, during the first position the sampling value at the input of the first register is multiplied by a first coefficient and the sampling value at the output of the last register is multiplied by a last coefficient and during a second position, the sampling value at the input of the first register is multiplied by the last coefficient and the sampling value at the output of the last register by the first coefficient. Consequently, during the second position of the change-over switch, the sub-sequence is multiplied by coefficients which, relative to the first position, are symmetrically interchanged. At an even number of registers the sampling value of the register located in the center of the series-arranged registers is always multiplied by the same coefficient, so that no change-over switch is required. A signal which in the subsequent circuits is further processed at twice the switching frequency is available at the output of the first adder. The word length of the output signal of the low-pass filter has been increased by the word length of a coefficient.

The change-over switches may always be disposed before one of the two inputs of the multipliers. An input of the multiplier may in this situation be coupled to at least one coefficient-storing read-only memory.

The low-pass filter can be used in a television receiver for reducing the sampling frequency of an analog-to-digital converter, coupled to one video modulator. In practice it has been found for this usage that it is sufficient for the number m of the registers to be equal to five for a sampling frequency-switching frequency ratio of three.

In a further development of the invention it is provided that the output of the first adder is coupled to a first noise shaper which includes a second adder to which the output signal of the first adder and the less significant bits of the output signal of the second adder are applied, which are passed through at least a further register to which a second clock signal having a clock frequency which is twice as high as the switching frequency is applied. The noise shaper shifts a part of the noise signal from the frequency range in which the low-pass filter has its transmission region, into a higher-frequency range, as is also known from FIG. 2 of the said publication.

As was demonstrated by practical trials, it is particularly important to reduce the noise in the luminance signal. To that end a further low-pass filter for suppressing the chrominance signal is arranged before the first noise shaper. To restore the chrominance signal, the output of the first adder is then connected to a band-pass filter for passing the chrominance signal.

The noise in the chrominance signal can now be reduced using a second noise shaper. To that end it is provided that the output of the band-pass filter is connected to a second noise shaper which includes a third adder to which the output signal of the first adder is applied and receives the less significant bits of the output signal of the third adder which are fed through at least two series-arranged registers to which the second clock signal is applied.

DESCRIPTION OF THE DRAWINGS

Embodiments of the invention will now be described by way of example with reference to the accompanying drawings. Therein.

DETAILED DESCRIPTION

Figure 1:
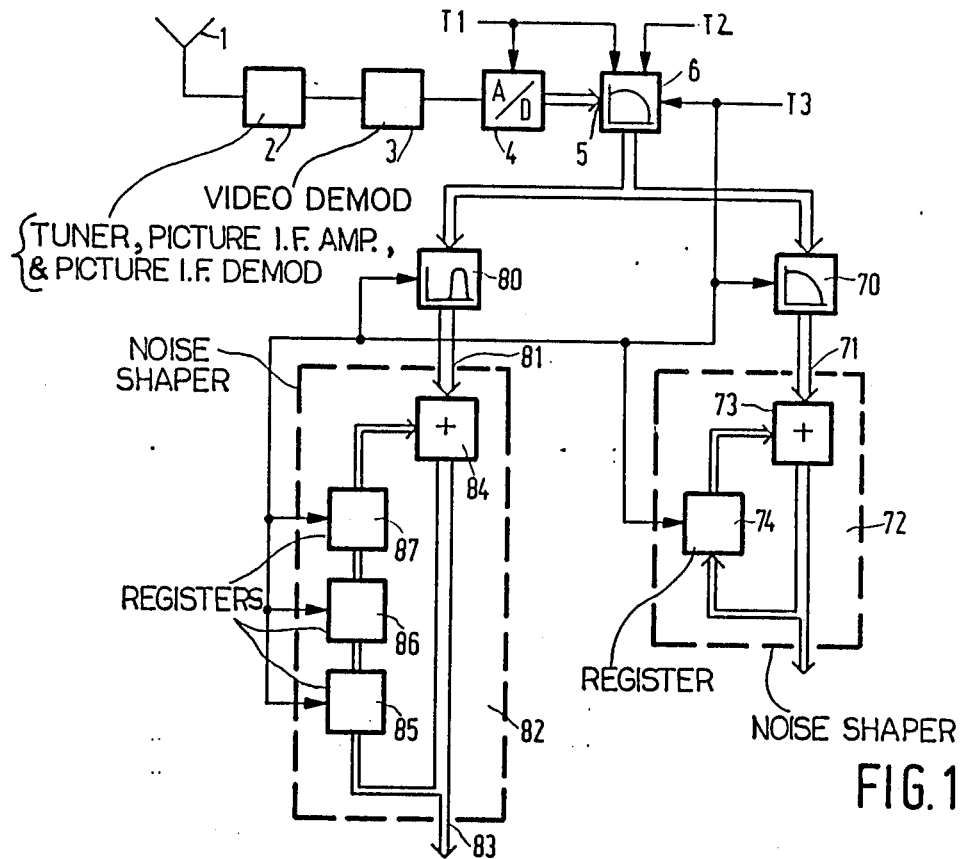
FIG. 1 shows a portion of a television receiver incorporating a digital low-pass filter according to the invention.

In FIG. 1 a high-frequency video signal is received from an aerial 1 and applied to a circuit 2 comprising a tuner, a picture intermediate frequency amplifier and a picture intermediate frequency demodulator. The intermediate-frequency television signal is converted into a low-frequency television signal in a video demodulator 3. In a subsequent analog-to-digital converter 4 the analog signal is converted into a digital signal which is available at the output of the converter 4 as a sequence of binary encoded sampling values. The digital output signal of the analog-to-digital converter 4, whose sampling frequency T1 is 20.25 MHz has a resolution of 7 bits and is applied to an input 5 of a digital low-pass filter 6.

Figure 2:
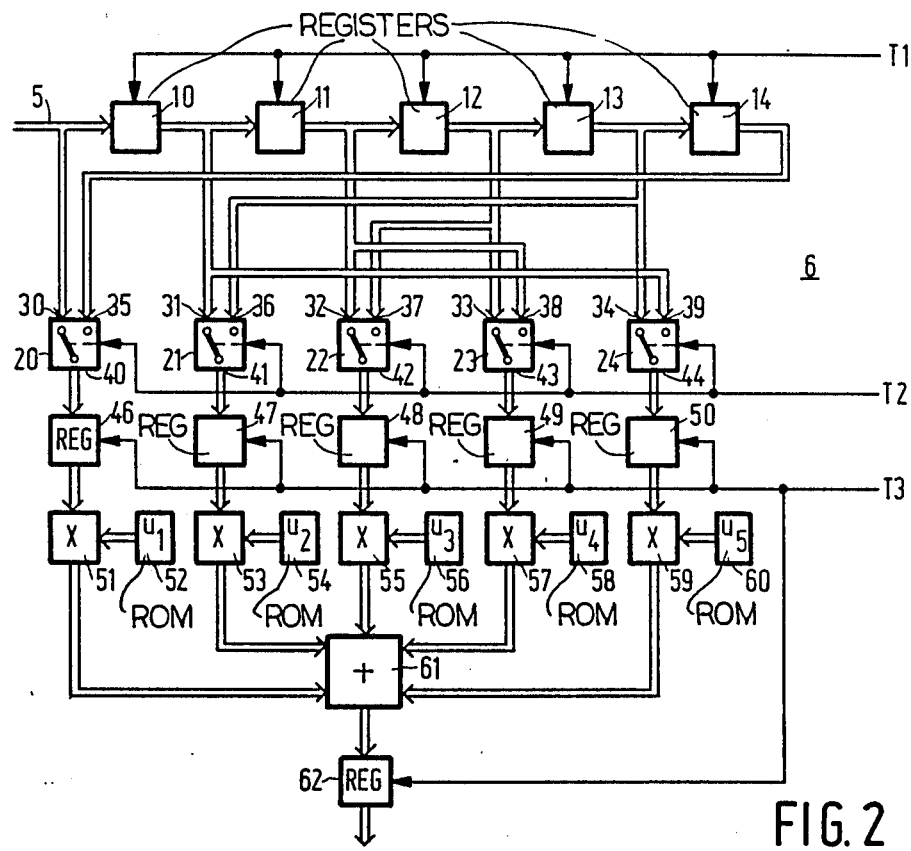
FIG. 2 shows a first embodiment of the invention.

FIG. 2 shows a first embodiment of the digital low-pass filter 6. The input 5 of the low-pass filter is also the input of a register 10, and is further connected to a first input 30 of a change-over switch 20. The register 10 is followed by four further, series-arranged registers 11 to 14. The output of the register 10 is connected to a first input 31 of a change-over switch 21, the output of the register 11 to a first input 32 of a change-over switch 22, the output of the register 12 to a first input 33 of a change-over switch 23 and the output of the register 13 is connected to a first input 34 of a change-over switch 24. Furthermore, the output of the register 14 is connected to a second input 35 of the change-over switch 20, the output of the register 13 to a second input 36 of the change-over switch 21, the output of the register 12 to a second input 37 of the change-over switch 22, the output of the register 11 to a second input 38 of the change-over switch 23 and, finally, the output of the register 10 to a second input 39 of the change-over switch 24. In addition, a clock signal T1 is applied to the registers 10 to 14.

The output signals of the change-over switches 20 to 24 are applied to registers. An output 40 of the change-over switch 20 is connected to a register 46, an output 41 of the change-over switch 21 to a register 47, an output 42 of the change-over switch 22 to a register 48, an output 43 of the change-over switch 23 to a register 49, and an output 44 of the change-over switch 24 to a register 50. A switching signal T2 having a frequency of 6.75 MHz is applied to the change-over switches 20 to 24. When the change-over switches 20 to 24 are in a first position, the first input of a change-over switch is always connected to the output, and during the second position of the second input is always connected to the output. Moreover, a clock signal T3 having a frequency of 13.5 MHz is applied to the registers 46 to 50.

The output signals of the registers 46 to 50 are multiplied in a multiplier by coefficients which are assigned to a multiplier and are stored in a read-only memory. Consequently, a multiplier 51 is connected to a read-only memory 52 and to the register 46, a multiplier 53 is connected to a read-only memory 54 and to the register 47, a multiplier 55 to a read-only memory 56 and to the register 48, a multiplier 57 to a read-only memory 58 and to the register 49, and a multiplier 59 to a read-only memory 60 and to the register 50. In the read-only memories 52, 54, 56, 58 and 60 coefficients $u_1$ to $u_5$ are stored. The output signals of the multipliers 51, 53, 55, 57 and 59 are added together in an adder 61. The result of this adding operation in the adder 61 is applied to a register 62 which also receives the clock signal T3.

A sixth change-over switch whose first input would have a connection to the output of the register 14 and whose second input would be connected to the input 5 of the register 10, a sixth register connected to the output of this change-over switch and a sixth multiplier coupled thereto and a sixth read-only memory are not required, as, as will be described hereinafter, the coefficient $u_6$ is approximately equal to zero.

Figure 3:
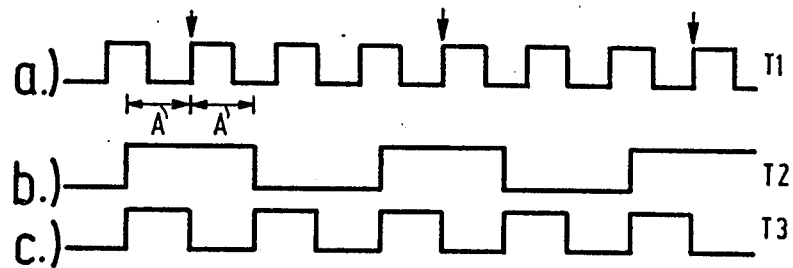
FIG. 3 shows diagrams to explain FIG. 2.

FIG. 3 shows the waveform of three clock signals T1, T2 and T3, with reference to which the digital low-pass filter of FIG. 2 sill be described. A new sampling value is entered into the registers 10 to 14 at each positive edge of the clock signal T1. The sampling values which are conveyed via the change-over switches 20 to 24 are entered in the registers 56 to 50 at each positive edge of the clock signal T3. Simultaneously, the change-over switches 20 to 24 are switched by the clock signal T2. The change-over switches are in the first position after a positive edge of the clock signal T2 has appeared and in the second position after a negative edge of the clock signal T2 has appeared. Consequently, a new sampling value is calculated after each switching action. The switching instants are chosen such that they are always located symmetrically to predetermined positive reference edges of the clock signal T1. In FIG. 3 arrows indicate such positive reference edges. As mentioned above, the switching instants of the change-over switches are the negative and positive edges of the clock signal T2. The time spacing between a reference edge and the two switching instants are equal and, in FIG. 3, this spacing is denoted by A and amounts to ¾ of a period of a clock signal T1. Because of this choice of the temporal sequence of the clock signals T1 and T2 and consequently also of the clock signal T3 the number of coefficients is equal to the number of multipliers.

As mentioned in the foregoing, the sampling frequency is reduced by a factor of 1.5 with the aid of the digital low-pass filter and frequency components located in the frequency range of interest (to 5 MHz) are suppressed. The coefficients for the low-pass filter can be calculated using the following formula:

$$f(t) = \sum_{n=-N+1}^{N} f(n) * d(n) \quad (1)$$

wherein $$d(n) = g1(n) * g2(n) \quad (2)$$

and $$g1(n) = \sin((t-n)C^*\pi)/((t-n)\pi), \quad (3)$$

$$g2(n) = 0{,}54 + 0{,}46 * \cos(\pi(n-t)/N), \quad (4)$$

wherein $-N+1 \leq n \leq N$ and f(n) is the sub-sequence stored in the registers 10 to 14. The function f(t) is the calculated sampling the value at the output of the low-pass filter 6. The distance between a positive edge of the clock signal T1 and the subsequent switching instant, relative to a period of the clock signal T1 equal to unity is denoted by t. The function t can assume the values 0.25 and 0.75. The function d(n) is the sequence of coefficients. The function g1(n) is the Fourier transform of a square-wave function in the frequency range. An ideal low-pass filter is represented in the frequency range by such a square-wave function. As the calculations are based on a finite number of sampling values, the frequency response of an ideal low-pass filter is not realized in the frequency range. Therefore, the function g1(n) is weighted with a window function g2(n). Here, a Hamming-window is used for the window function g2(n). The bandwidth of the low-pass filter is determined by the factor C in equation (3), for which 0.7 has been chosen.

For the low-pass filter illustrated in FIG. 2 the following coefficients are calculated:

| | t = 0,25: | | t = 0,75: |
|---|---|---|---|
| n | d(n) | n | d(n) |
| −2 | −0,0619 | −2 | −0,0026 |
| −1 | 0,0642 | −1 | −0,0497 |
| 0 | 0,6548 | 0 | 0,3661 |
| 1 | 0,3661 | 1 | 0,6548 |
| 2 | −0,0497 | 2 | 0,0642 |
| 3 | −0,0026 | 3 | −0,0619 |

As the coefficient for d(3) at t=0.25 and consequently for d(−2) at t=0.75 is very small, it is assumed to be equal to zero and in this way a multiplier is saved. No sixth change-over switch switching between the input of the first and the output of the last registers is therefore utilized in FIG. 2.

Because of the choice of the switching instants which are located symmetrically around a reference sampling value, the sequences d(n) of the coefficients are in the reverse order for t=0.25 and t=0.75. For the calculation of the coefficients it is recommendable to opt for a temporal spacing t of 0.25 and 0.75, to enable calculation of the exact values. In a practical example, the clock signals T1 and T2 and consequently also T3 can be shifted somewhat, it only must be ensured that the sampling values are multiplied by the same coefficients, as for the symmetrical position of the switching instants relative to the reference sampling values.

Using the circuit arrangement according to the invention, it is alternatively possible to effect a frequency reduction by a factor larger than 1.5. The circuit can be used with particular advantage when a reduction by a factor equal to the ratio w/2 between the input signal frequency and the output signal frequency is effected, wherein w is an odd integer. In this case the number of coefficients is, namely, not larger than the number of multipliers.

In order to read the multiplying operation as simple as possible, the values listed herebelow have been used for the coefficients. For the sake of simplicity, the coefficients are denoted as follows:

$$d(n, t=0{,}25) = u_n + 3 \quad (5)$$

For the coefficients $u_1$ to $u_5$ the following values are obtained:

$u_1 = -0{,}0625$
$u_2 = 0{,}0703$
$u_3 = 0{,}672$
$u_4 \; 0{,}3906$
$u_5 = -0.0703$

Figure 4:
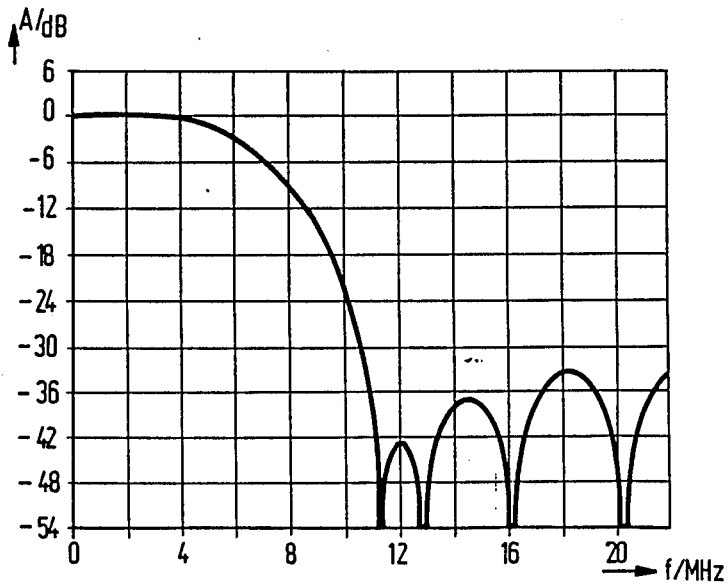
FIG. 4 shows a frequency response of the digital low-pass filter of FIG. 2, FIGS. 5 and 6 show two noise spectra

The frequency response of the low-pass filter for these coefficients is shown in FIG. 4. If a different frequency response of the low-pass filter should be realized, other coefficients must be calculated.

As further is shown in FIG. 1, the output signal of the digital low-pass filter 6 is applied to a digital low-pass filter 70 which suppresses the chrominance signal. The output of the low-pass filter 70 is connected to an input 71 of a noise shaper 72. This noise shaper 72 comprises an adder 73 and a register 74. At the input 71 of the noise shaper 72, which at the same time constitutes an input of the adder 73, sampling values of, for example, 15 bits are available. Because of the multiplication by the coefficients in the low-pass filter 6, the input signal is increased from 7 bits to 15 bits. The output signal of the register 74 is applied to a further input of the adder 73. The most significant 7 bits of the output signal of the adder 73 form the output signal of the noise shaper 72. The 8 bits of a lower significance are applied to the register 74. The low-pass filter 70 and the register 74 receive the clock signal T3.

Figure 5:
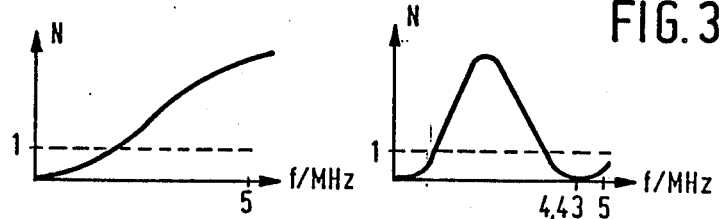

The output signal of the noise shaper 72 is the luminance signal rounded-off to 7 bits. The bits of a lower significance are returned to the adder 73 via the register 74 and added to the input signal. As described in the said periodical, the signal-to-noise ratio is improved by a noise shaper in that the noise is moved from the relevant frequency range to a different frequency range. FIG. 5 illustrates the mode of operation of the noise shaper 72. In that drawing the noise N over the relevant frequency range is shown. If no noise shaper were present, the signal would have a constant noise spectrum at N=1, as is schematically represented by the broken line. The noise shaper 72 reduces the noise at low-frequency signals and increases it at signals of higher frequencies.

Figure 6:
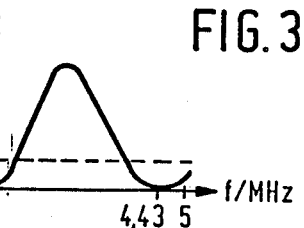

Furthermore, the low-pass filter 6 is connected to a bandpass filter 80 which only allows the chrominance signal to pass. The output of the bandpass filter 80 is connected to an input 81 of a noise shaper 82 at whose output 83 the chrominance signal is available. The noise shaper 82 comprises an adder 84 and three registers 85, 86 and 87. The input 81 of the noise shaper 82 is also an input of the adder 84. At the output of the noise shaper 82 the most-significant 7 bits of the 15-bit output signal of the adder 84 are now utilized. The 8 bits of lower significance are applied to the other input of the adder 84 via the registers 85, 86 and 87. In addition, the clock signal T3 is applied to the registers 85, 86 and 87 and to the bandpass filter 80. The noise shaper 82 reduces the noise in the frequency range around the 4.43 MHz chrominance sub-carrier and increases the noise in the region of 2 to 3 MHz. This is also shown schematically in FIG. 6.

Also in the low-pass filter 70 and the bandpass filter 80 an increase in the word length is effected by the multiplication by coefficients. The word length can be reduced again by truncation.

The output signal of the low-pass filter 6 can also be applied directly to the noise shaper 72. This improves the signal-to-noise ratio of the low-frequency luminance signal but the S/N ratio of the higher frequency luminance signals and the chrominance signal becomes slightly poorer.

Figure 7:
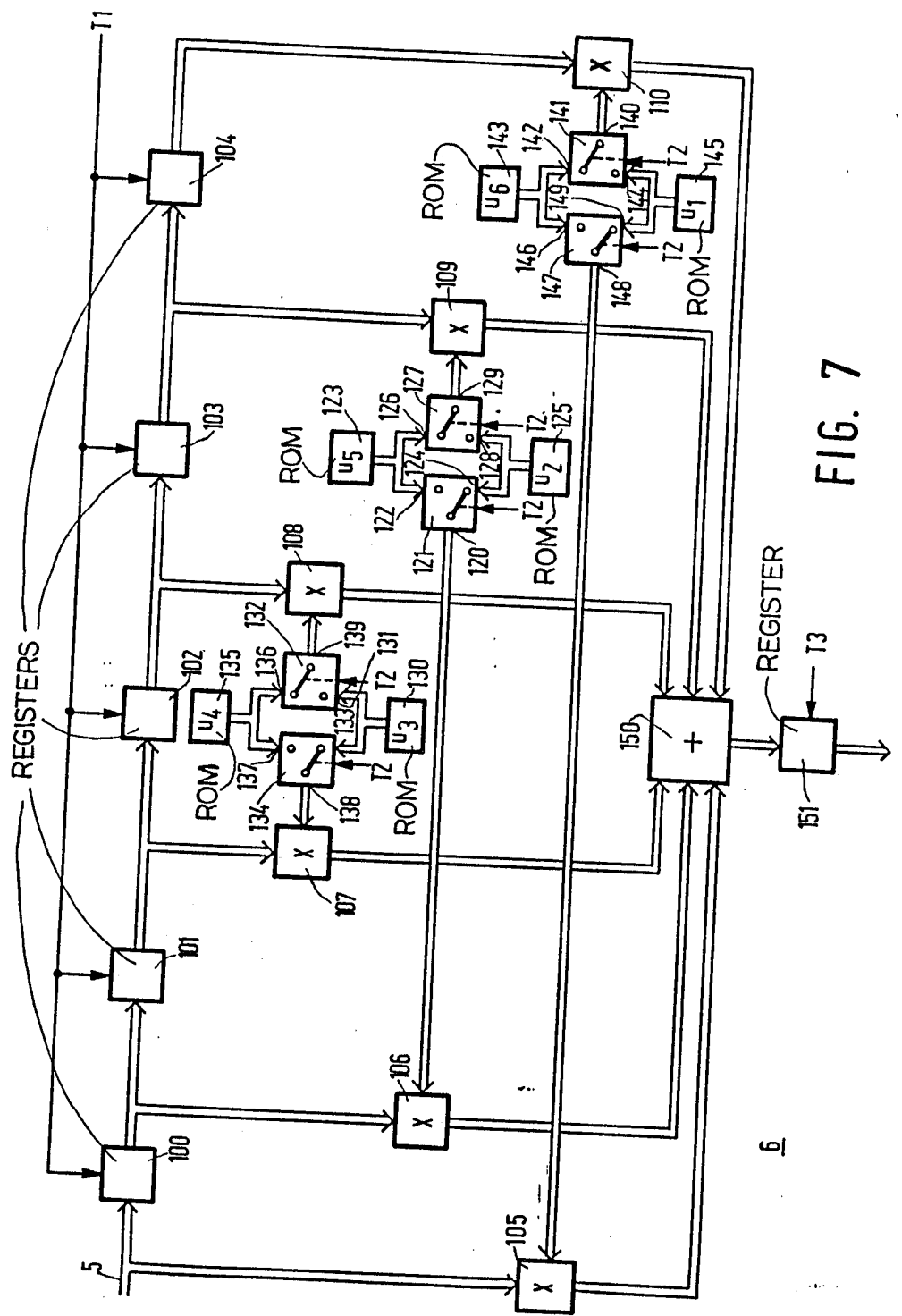
FIG. 7 illustrates a second embodiment of the invention.

FIG. 7 shows a second embodiment of the digital low-pass filter 6. The input 5 of the low-pass filter is at the same time the input of a register 100 and of a multiplier 105. A number of registers 101, 102, 103 and 104 are arranged in series subsequent to the register 100. Each register 100 to 104 further receives the clock signal T1. The output signal of the register 100 is applied to one input of a multiplier 106 whose other input is connected to an output 120 of a change-over switch 121. An input 122 of the change-over switch 121 is connected to a read-only memory 123 and a further input 124 to a read-only memory 125. Furthermore, the read-only memory 123 is connected to an input 126 of a change-over switch 127 and the read-only memory 125 to an input 128 of this change-over switch 127. An output 129 of the change-over switch 127 is connected to one input of a multiplier 109 whose other input receives the output signal of the register 103.

A further read-only memory 130 is connected to an input of a change-over switch 132 and also an input 133 of a change-over switch 134. A read-only memory 135 provides a connection to an input 136 of the change-over switch 132 and to an input 137 of the change-over switch 134. An output 138 of the change-over switch 134 is connected to an input of a multiplier 107 to whose other input the output signal of the register 101 is applied and an output 139 of the change-over switch 132 is connected to one input of a multiplier 108, whose other input receives the output signal of the register 102.

The output of the last register 104 is connected to an input of a further multiplier 110, whose other input is connected to an output 140 of a change-over switch 141. One input 142 of the change-over switch 140 is connected to a read-only memory 143 and another input 144 is connected to the read-only memory 145. An input 146 of a change-over switch 147, whose output 148 is connected to the other input of the multiplier 105 is connected to the read-only memory 143 and an input 149 of this change-over switch 147 is connected to the read-only memory 145. The output signals of the multipliers 105 to 110 are added together in an adder 150. The output signal of the adder 150 is applied to a further register 151. The output signal of the low-pass filter is then available at the output of the register 151. The change-over switches 121, 127, 132, 134, 141 and 147 are controlled by the clock signal T2 and the clock signal T3 is applied to the register 151.

When the change-over switches are in the first position, the output 120 of the change-over switch 121 is connected to the input 124, the output 129 of the change-over switch 127 to the input 126, the output 139 of the change-over switch 132 to the input 136, the output 138 of the change-over switch 134 to the input 133, the output 140 of the change-over switch 141 to the input 142 and the output 148 of the change-over switch 147 to the input 149. In the second position, the output of each change-over switch is then connected to its other input. In the read-only memories 123, 125, 130, 135 and 145 the coefficients $u_1$ to $u_5$ are stored. The read-only memory 143 is available for the sixth coefficient, which, as mentioned above, is equal to zero.

What is claimed is:

1. A digital low-pass filter comprising m series-arranged registers, a digital input signal, which is present as a sequence of amplitude-discrete sampling values having a sampling frequency determined by a clock signal, being applied to the first of said m registers, multipliers or multiplying by coefficients switchably applied to said multipliers, sub-sequences of (m+1) sampling values at the input of the first register and the outputs of the registers, and a first adder to which the output signals of the multipliers are applied and added for obtaining a filter output, and a change-over switch coupled to the input of said first register and the outputs of the registers, and coupled at one of two inputs of each of said multipliers such that in one position of the change-over switch a $j^{th}$ sampling value of the sub-sequences and in the other position of the change-over switch a $k^{th}$ sampling value of sub-sequences are always multiplied by the same coefficients, wherein $j+k=m+2$, wherein a ratio n of the sampling frequency to a switching frequency of the change-over switch exceeds two and is a whole number, and wherein two switching instants of the change-over switches are symmetrical with respect to each $n^{th}$ sampling instant of a sequence.

2. A digital low-pass filter as claimed in claim 1, wherein the change-over switches precede the input of the multipliers to which a sampling value of the sub-sequence is applied.

3. A digital low-pass filter as claimed in claim 2, characterized in the the change-over switches precede the input of the multiplier to which a coefficient is applied.

4. A digital low-pass filter as claimed in claim 1 wherein the other one input of said each multipliers is coupled to at least one read-only memory in which a coefficient is stored.

5. A digital low-pass filter as claimed in claim 1 wherein the number m of the registers is equal to five and wherein a sampling frequency-to-switching frequency ratio n is equal to three.

6. A color television receiver comprising a digital low-pass filter as claimed in any one of the preceding claims, and further comprising a video demodulator coupled to an A/D converter, whose output is connected to the first register.

7. A color television receiver as claimed in claim 6, further comprising a first noise shaper coupled to the output of the first adder for improving the signal-to noise ratio of the signal received from said first adder which includes a second adder to which the output signal of the first adder is applied and also the less significant bits of the output signal of the second adder via at least one further register which receives a second clock signal having a clock frequency which is double a switching frequency.

8. A color television receiver as claimed in claim 7, further comprising an additional low-pass filter for suppressing a chrominance signal which precedes the first noise shaper.

9. A color television receiver as claimed in claim 7, further comprising a bandpass filter coupled to the output of the first adder for transmitting a chromiance signal.

10. A color television receiver as claimed in claim 9, further comprising a second noise shaper coupled to the output of the bandpass filter for reducing the noise in said chrominnace signal, which incorporates a third adder to which the output signal of the first adder is applied and to which the less significant bits of the output signal of the third adder are applied via at least two series-arranged registers to which the second clock signal is applied.

* * * * *